US010277426B1

(12) United States Patent
Kuehlwein et al.

(10) Patent No.: US 10,277,426 B1
(45) Date of Patent: *Apr. 30, 2019

(54) REDUCING SUPPLY NOISE IN CURRENT MODE LOGIC TRANSMITTERS

(71) Applicant: Micron Technology, Inc., Boise, ID (US)

(72) Inventors: Jeremy Kuehlwein, Woodbury, MN (US); Gregory A. King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/113,538

(22) Filed: Aug. 27, 2018

Related U.S. Application Data

(63) Continuation of application No. 15/970,630, filed on May 3, 2018.

(51) Int. Cl.
*H04L 25/02* (2006.01)
*H03K 19/0185* (2006.01)

(52) U.S. Cl.
CPC . *H04L 25/0294* (2013.01); *H03K 19/018578* (2013.01); *H04L 25/0272* (2013.01)

(58) Field of Classification Search
CPC ............ H04L 25/0294; H04L 25/0272; H03K 19/018578
See application file for complete search history.

(56) References Cited

U.S. PATENT DOCUMENTS

| | | | | |
|---|---|---|---|---|
| 5,610,539 A | * | 3/1997 | Blauschild | H03K 19/086 326/127 |
| 6,924,668 B2 | * | 8/2005 | Muller | H03K 5/003 326/112 |
| 7,560,957 B2 | * | 7/2009 | Chen | H03K 19/01707 326/112 |
| 2007/0229131 A1 | * | 10/2007 | Ibuka | H03L 7/095 327/158 |
| 2011/0267129 A1 | * | 11/2011 | King | H03K 3/356113 327/307 |
| 2016/0254813 A1 | * | 9/2016 | Cho | H03K 19/0013 326/115 |

FOREIGN PATENT DOCUMENTS

GB 2224610 A * 5/1990 ....... H03K 19/01806

* cited by examiner

*Primary Examiner* — Freshteh N Aghdam
(74) *Attorney, Agent, or Firm* — Holland & Hart LLP

(57) ABSTRACT

Methods, systems, and devices for mitigating supply noise in single-ended current mode logic (CML) transmitters are described. A first current source may generate a first bias current for a first differential transistor pair included in a CML transmitter, and a second current source may generate a second bias current for a second differential transistor pair. The first differential transistor pair may route the first bias current through either leg of the first differential transistor pair based on a polarity of an input signal and the second differential transistor pair may route the second bias current through either leg of the second differential transistor pair based on the polarity of the input signal. Based on a first polarity, the second bias current may be routed to a ground reference, and based on a second polarity, the second bias current may be routed through the first differential transistor pair to modify a load current internal to the CML transmitter.

20 Claims, 5 Drawing Sheets

REDUCING SUPPLY NOISE IN CURRENT MODE LOGIC TRANSMITTERS

CROSS REFERENCE

The present application for Patent is a continuation of U.S. patent application Ser. No. 15/970,630 by Kuehlwein et al., entitled "Reducing Supply Noise in Current Mode Logic Transmitters," filed May 3, 2018, assigned to the assignee hereof, which is expressly incorporated by reference in its entirety herein.

BACKGROUND

The following relates generally to reducing supply noise and more specifically to reducing supply noise in current mode logic (CML) transmitters.

Many electrical devices (e.g., integrated circuits) may utilize a single-ended CML transmitter, which may also be referred to as a single-ended CML driver, to output data across a data link. For example, some single-ended CML transmitters may support outputting serial data over a data link at a relatively high signaling rate.

Memory devices are one example of a type of device that may utilize one or more CML transmitters, such as single-ended CML transmitters. Memory devices are widely used to store information in various electronic devices such as computers, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device. A memory device may use a single-ended CML transmitter to output data across a data link, including to output data to a device external to the memory device (e.g., via an output pad of the memory device).

Improved solutions for mitigating supply noise in single-ended output CML transmitters, whether included within memory devices or other types of electronic devices and systems, are desired.

DETAILED DESCRIPTION

Figure 1:
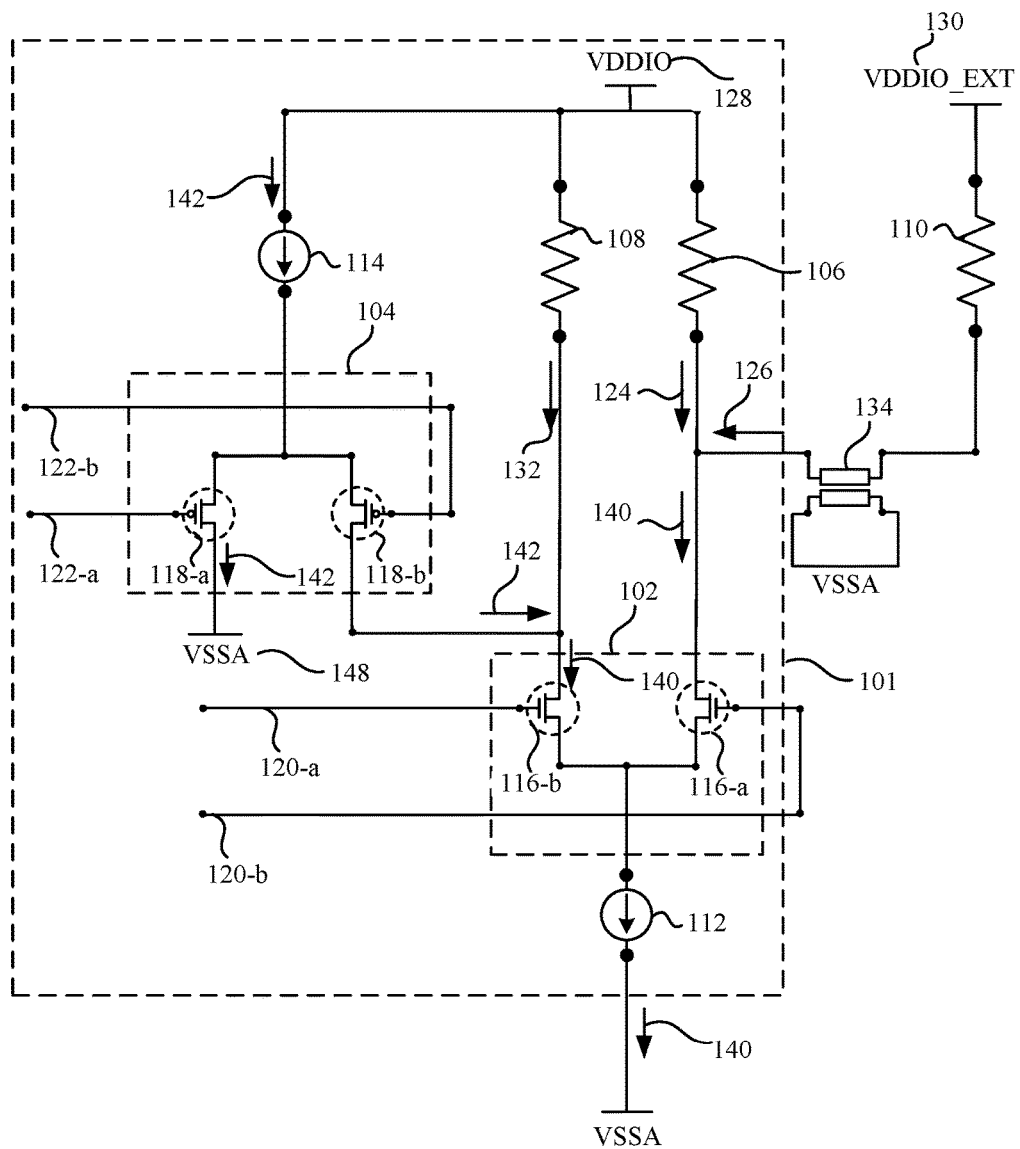
FIG. 1 illustrates an enhanced single-ended CML transmitter in accordance with examples of the present disclosure.

An enhanced single-ended current mode logic (CML) transmitter (or enhanced single-ended CML output driver), as described herein, may be configured to reduce supply noise associated with an input signal for the single-ended CML transmitter toggling between polarities. The described single-ended CML transmitter may, for example, mitigate issues resulting from polarity changes of differential input signals.

By way of example, a single-ended current CML transmitter may be used to output data across a data link. Some single-ended CML transmitters may receive a differential input signal and drive a non-differential output signal using a single output line. As a result, when the differential input signal switches polarity, some single-ended CML transmitters may experience a variable current draw from a voltage supply. Thus, such CML transmitters may be susceptible to supply noise as the differential input signal toggles between polarities.

A single-ended CML output transmitter may generally include a differential transistor pair, a pair of load resistors, and a current source. In some cases, the differential transistor pair may receive an input signal (e.g., a differential input signal) through one or more input lines associated with the differential transistor pair (e.g., one input line coupled with a gate of the first transistor and the other input line coupled with a gate of the second transistor). In some examples, the input signal may toggle between a first polarity and a second polarity. For example, the input signal may have the first polarity when the first input line has a voltage less than the second input line and the second polarity when the first input line has a voltage greater than the second input line. The first and second polarities may respectively correspond to different logic values (e.g., the input signal having the first polarity may correspond to a logic "1," and the input signal having the second polarity may correspond to a logic "0").

In a single-ended CML output transmitter, the output may be obtained from one side of the differential transistor pair, which thus may also be referred to as an output leg or output branch of the differential transistor pair. In some examples, the single-ended CML output transmitter may be communicatively coupled with an external load (e.g., external to a device that includes the CML transmitter), which may be modeled as and thus referred to as an external resistor, and the communication between the single-ended CML output transmitter and the external resistor may include an external termination (e.g., an output pin or pad may be included in the transmission path between the output of the CML transmitter and the external resistor). In some cases, an impedance of the external resistor may be configured to be similar to (e.g., the same value as) one or both of the internal resistors (e.g., through impedance matching).

A differential transistor pair within a single-ended CML transmitter may route the current generated by the current source (which may be referred to as a bias current for the differential transistor pair or as a bias current for the CML transmitter) through either of the two legs of the differential transistor pair depending on the polarity of the input signal. For example, when the input signal has the first polarity, the differential transistor pair may route the bias current through a first component (e.g., an internal load resistor) included in the output leg (that is, the leg from which the output is taken). Because the external resistor may be similar (e.g., be equal) in impedance to both internal load resistors, and thus that of the internal load resistor included in the output leg, at least a portion (e.g., half) of the bias current may pass through the internal resistor included in the output leg and another portion (e.g., the other half) of the bias current may pass through the external resistor. In other words, the internal and external resistors may thus be configured as a current divider with branches of approximately equal resistance or impedance.

In some single-ended CML transmitter examples, when the input signal has the second polarity, however, a different portion (e.g., all) of the bias current may pass through the other internal resistor (that is, the internal resistor included in the non-output leg of the first differential transistor pair). Thus, as the input signal toggles between the first and second polarities (e.g., as the input signal carries incoming data), a voltage supply associated with a single-ended CML transmitter may experience a current draw that toggles between the full value of the bias current and the half value of the bias current. As a result, some single-ended CML transmitters may experience or induce undesirable supply noise associated with the input signal toggling between polarities.

According to one or more aspects of the techniques describes herein, an enhanced single-ended CML transmitter (or enhanced single-ended CML output driver) may be configured to reduce the supply noise associated with an input signal toggling between polarities. In some cases, the enhanced CML transmitter may include two differential transistor pairs. The enhanced CML transmitter may further include a pair of load resistors, with each load resistor being included in one leg of the first differential transistor pair and communicatively coupled with one of the transistors in the first differential transistor pair.

In some cases, both the first differential transistor pair and the second differential transistor pair may include a first transistor and a second transistor, though it is to be understood that cascoded configurations are also possible. In some cases, when the first transistor and the second transistor associated with the first differential transistor pair are nmos transistors, the first transistor and the second transistor associated with the second differential transistor pair may be pmos transistors. In some examples, when the first transistor and the second transistor associated with the first differential transistor pair are pmos transistors, the first transistor and the second transistor associated with the second differential transistor pair may be nmos transistors.

The first differential transistor pair may be configured to receive a first input signal via a first pair of input lines. The second differential transistor pair may be configured to also receive the first input signal but via a second pair of input lines, or, alternatively, the second differential transistor pair may be configured to receive via the second pair of input lines a second input signal that is time-synchronized (e.g., changes polarity synchronously) with the first input signal. The first differential transistor pair may be associated with a first current source and the second differential transistor pair may be associated with a second current source. In some cases, the first current source may be configured to generate a bias current for the first differential transistor pair, which may be referred to a first bias current and which the first differential transistor pair may route through either leg of the first differential transistor pair based on the polarity of the first input signal. The second current source may be configured to generate a bias current for the second differential transistor pair, which may be referred to as a second bias current and which the second differential transistor pair may route through either leg of the second differential transistor pair based on the polarity of the first (or second) input signal.

When the first input signal has a first polarity, the first bias current may be routed through the output leg of the first differential transistor pair. When routed through the output leg, the first bias current may be divided into a first load current routed through an internal resistor included in the output leg and an output current routed through an external resistor. Additionally, when the input signal has the first polarity, the second bias current generated by the second current source may be routed by the second differential transistor pair to a ground reference or network, may be routed through some other current path that does not include the first differential transistor pair, or may be deactivated (e.g., shut down).

When the first input signal has a second polarity, the first bias current may be routed through the non-output leg of the first differential transistor pair and thus through an internal resistor included in the non-output leg. Concurrently or simultaneously, the second bias current may be routed by the second differential transistor pair into the non-output leg of the first differential transistor pair. As a result, when the first input signal has the second polarity, the current through the non-output leg of the first differential transistor pair may be based on (e.g., configured by or modified by) the second bias current, and thus the second bias current may be configured to modify or set the magnitude of the current through the internal resistor in the non-output leg. More specifically, when the first input signal has the second polarity, the current through the internal resistor in the non-output leg, which may be referred to as a second load current, may have a magnitude equal to the first bias current minus the second bias current. Thus, configuring the second bias current based on the output current (e.g. configuring the second bias current to have a same magnitude as the output current) may reduce the toggling of current draw on the voltage supply associated with the enhanced CML transmitter, and thus may reduce supply noise.

In some examples, the second bias current may be adjusted, for example, based on an operational mode or operating conditions, as generating the second bias current may reduce supply noise but impact overall power consumption. For example, the second bias current may be adjusted based on a supply noise measurement (e.g., generated or increased when supply noise exceeds one or more threshold values, reduced or shut down when supply noise is below one or more threshold values). Additionally or alternatively, an operational mode for the enhanced CML transmitter may be determined and the second bias current may be adjusted based on operational mode. The operational mode may include a power conservation mode and a performance mode. A power conservation mode may be one in which power conservation is prioritized over CML transmitter performance such that performance may be suboptimal but less power may be consumed relative to other operating modes. A performance mode may be one in which CML transmitter performance is prioritized over power conservation such that power consumption may be more than another operating mode and device performance may be optimized or superior relative to another operating mode. In some cases, the second bias current may be adjusted (e.g., generated, increased, decreased, or shut down) based on the operational mode of the enhanced CML transmitter. In some examples, the second bias current may be shut down (or decreased) during a power conservation mode, and the second bias current may be generated (or increased) during a performance mode.

Features of the disclosure introduced above are further described below in the context of the example single-ended CML output transmitter of FIG. 1. These and other features of the disclosure are further illustrated by and described with reference to FIG. 2 through FIG. 5 that relate to exemplary configurations and operation of an enhanced CML transmitter.

FIG. 1 illustrates an example of an enhanced CML transmitter 101 in accordance with various examples of the present disclosure. The enhanced CML transmitter 101 may include a first differential transistor pair 102, a first internal resistor 106, a second internal resistor 108, and a first current source 112. The enhanced CML transmitter 101 may further include or may be coupled with a second differential transistor pair 104, which in turn may be coupled with a second current source 114. The enhanced CML transmitter 101 may be included in a deployment 100 in which it is coupled with an external load, such as external resistor 110. The first differential transistor pair 102 may be communicatively coupled with and configured to route current generated by the first current source 112; the current generated by the first current source 112 may be configured as a bias current for the first differential transistor pair 102 and may be referred to as first bias current 140. The second differential transistor pair 104 may be communicatively coupled with and configured to route current generated by the second current source 114; the current generated by the second current source 114 may be configured as a bias current for the second differential transistor pair 104 and may be referred to as second bias current 142.

The first differential transistor pair 102 may include a second transistor 116-b and a first transistor 116-a. Further, the second differential transistor pair 104 may include a first transistor 118-a and a second transistor 118-b. In some cases, the second transistor 116-b and the first transistor 116-a may be n-type metal-oxide-semiconductor (nmos) transistors, and the first transistor 118-a and the second transistor 118-b may be p-type metal-oxide-semiconductor (pmos) transistors. Alternatively, in some cases, the second transistor 116-b and the first transistor 116-a may be pmos transistors, and the first transistor 118-a and the second transistor 118-b may be nmos transistors, and aspects of the enhanced CML transmitter 101 shown in the example of FIG. 1 may be reconfigured accordingly, as would be appreciated by one of ordinary skill in the art. It is to be understood that, in some examples, either or both the first differential transistor pair 102 and the second differential transistor pair 104 may comprise a cascoded transistor configuration (not shown).

The second transistor 116-b of the first differential transistor pair 102 may be communicatively coupled with the second internal resistor 108 (e.g., a drain of the second transistor 116-b may communicatively be coupled with the second internal resistor 108). The first transistor 116-a of the first differential transistor pair 102 may be communicatively coupled with the first internal resistor 106 (e.g., a drain of the first transistor 116-a may communicatively coupled with the first internal resistor 106). Additionally, the first differential transistor pair 102 may be communicatively coupled with (e.g., via the sources of the second transistor 116-b and the first transistor 116-a) and configured to route a first bias current 140 generated by the first current source 112 through either leg of the first differential transistor pair 102.

In the example of FIG. 1, the output may be obtained from the leg of the first differential transistor pair 102 that includes the first transistor 116-a and the first internal resistor 106, and thus this leg may be referred to as the output leg. In some cases, output leg may be communicatively coupled (e.g., via the drain of the first transistor 116-a) with a transmission line load via an external termination. For example, the communication between the single-ended CML output transmitter 101 and the external resistor 110 may include an external termination 134 (e.g., an output pin or pad). In some cases (e.g., high speed communication circuits), an impedance of the external load (such as external resistor 110) may be the same as the impedance of one or both of the internal resistors (such as the first internal resistor 106, the second internal resistor 108, or both).

The first differential transistor pair 102 may be configured to receive a first input signal 120 through a first input line 120-a and a second input line 120-b associated with the first differential transistor pair 102. In some cases, the first input line 120-a may be communicatively coupled with the gate of the second transistor 116-b of the first differential transistor pair 102, and the second input line 120-b may be communicatively coupled with the gate of the first transistor 116-a of the first differential transistor pair 102. The first input signal 120 may be described as having a first polarity when the first input line 120-a has a voltage less than the second input line 120-b and as having a second polarity when the first input line 120-a has a voltage greater than the second input line 120-b.

The first current source 112 may generate first bias current 140. When the first input signal 120 has the first polarity, the first differential transistor pair 102 (e.g., via the first transistor 116-a) may route the first bias current 140 through the output leg and thereby generate a first load current 124 and an output current 126. More specifically, when routed through the output leg, the first bias current 140 may be divided into the first load current 124 and the output current 126. In some cases, the impedance of the external resistor 110 and first internal resistor 106 are equal, and thus the first load current 124 may be equal in magnitude to the output current 126, with both the first load current 124 and the output current 126 half the magnitude of first bias current 140. A magnitude of current generated by the first current source 112 may referred to as IOL. Accordingly, as the first bias current 140 may be divided equally between the first load current 124 and the output current 126, the magnitude of each of the first load current 124 and the output current 126 may be equal to IOL/2. Thus, when the first input signal 120 has the first polarity, internal voltage supply VDDIO 128 may experience a current draw based on the first load current 124 (e.g., IOL/2), and external voltage supply VDDIO_EXT 130 may experience a current draw based on the output current 126 (e.g., IOL/2).

When the first input signal 120 has the second polarity (i.e., the first input line 120-a has a voltage greater than the second input line 120-b), the first differential transistor pair 102 (e.g., via the second transistor 116-b) may route the first bias current 140 through the non-output leg and thereby generate a second load current 132.

As described above, the second differential transistor pair 104 may be communicatively coupled with and configured to route current generated by the second current source 114, which may be referred to as second bias current 142. The second differential transistor pair 104 may be configured to route the second bias current 142 based on a second input signal 122, and may be configured to receive the second input signal 122 through a first input line 122-a and a second input line 122-b. In some cases, the first input line 122-a may be communicatively coupled with a gate of the first transistor 118-a of the second differential transistor pair 104, and the second input line 122-b may be communicatively coupled with a gate of the second transistor 118-b of the second differential transistor pair 104. The second input signal 122 may be referred to as having a first polarity when the first input line 122-a has a voltage less than the second input line 122-b and as having a second polarity when the first input line 122-a has a voltage greater than the second input line 122-b. The second signal 122 may be a separate signal configured to be time-synchronized (e.g., change polarity simultaneously) with the first signal 120. The second signal 122 may have a same or different common-mode voltage than the first signal 120. It is to be understood that, in some cases, the second signal 122 and the first signal 120 may be the same signal.

When the first input signal 120 has the second polarity (and thus the second current 122 also has the second polarity), the second differential transistor pair 104 (e.g., via the second transistor 118-b) may route the second bias current 142 into the non-output leg of the first differential transistor pair 102. As a result, when the first input signal 120 has the second polarity, the second load current 132 may be based on (e.g., configured by or modified by) the second bias current 142. More specifically, when the first input signal 120 has the second polarity, the second load current 132 may have a magnitude equal to the first bias current 140 minus the second bias current 142. Thus, by generating and routing an additional current through the non-output leg of the first differential transistor pair 102 when the first signal 120 has the second polarity, the second load current 132 may be modified or configured to have a desired magnitude (e.g., a magnitude equal to the first load current 124). For example, if the first bias current 140 is IOL, and the second bias current 142 is IOL/2, then the second load current 132 may be IOL/2, which as described may in some cases be the same magnitude as the first load current 124. Thus, configuring the second bias current 142 based on the output current 126 (e.g. configuring the second bias current 142 to have a same magnitude as the output current 126) may reduce a variation in current draw on internal voltage supply VDDIO 128 associated with the first input signal 120 changing polarities and thus may reduce supply noise for the enhanced CML transmitter 101.

Returning to when the first input signal 120 has the first polarity (and thus the second current 122 also has the first polarity), the second differential transistor pair 104 (e.g., via the first transistor 118-a) may route the second bias current 142 to a ground network (e.g., ground reference VSSA 148).

Alternatively or additionally to being based on the output current 126, the second bias current 142 may be proportional to the first bias current 140. For example, the second current source 114 may comprise a current mirror based on the first current source 112. Based on relationships between the first bias current 140 and the output current 126 (e.g., based on the magnitude of output current 126 being half or some other fraction of the magnitude of first bias current 140), current source 114 may be configured to generate the second bias current 142 as having a magnitude proportional to (e.g., half of or some other fraction of) the magnitude of first bias current 140).

In some examples, the second bias current 142 may be dynamically configurable and may be adjusted for example, based on an operational mode or operating conditions. For example, current source 114 may be a controllable current source (e.g., a digitally-controlled current source, or a current source that may be dynamically activated or de-activated, such as by a switching network (not shown)), and a controller (not shown) may configure (e.g., activate, specify, or adjust) the second bias current 142.

In some cases, the second bias current 142 may be configured based on a supply noise measurement for the enhanced CML transmitter 101 (e.g., a noise measurement associated with supply voltage VDDIO 128). For example, the second bias current 142 may be generated or increased when supply noise exceeds one or more threshold values, and reduced or shut down when supply noise is below one or more threshold values. In some cases, the enhanced CML transmitter 101 may be configured to operate without the second bias current 142 for a threshold period of time. As an example, the second differential transistor pair 104 may be deactivated for the threshold period of time, such that no second bias current 142 is generated. As the second differential transistor pair 104 remains deactivated, the voltage supply VDDIO 128 may experience an uneven current draw for the threshold period of time. As previously discussed, the uneven current draw may be associated with a supply noise at the enhanced CML Thus, after the threshold period of time, an average supply noise value may be measured. A magnitude of the second bias current 142 may be adjusted based on the measured supply noise. In some examples, the magnitude associated with the second current source 114 may be proportional to the difference in an average current draw experienced at the voltage supply VDDIO 128 during the threshold period of time.

Additionally or alternatively, the second bias current 142 may be configured or adjusted based on an operational mode for the enhanced CML transmitter 101. In some examples, possible operational modes may include a power conservation mode and a performance mode, which may have characteristics as described above. The second bias current 142 may be generated or increased when a performance mode or higher-performance mode is determined, and may be reduced or shut down when a power conservation or lower-performance mode is determined.

As described above, in existing single-ended output CML transmitters, an input signal switching between the first polarity and the second polarity may create an inherent supply noise problem due to a difference in magnitude between the load current in the output leg and the load current in the non-output leg of a differential transistor pair, a difference which may be referred to as a delta current. For example, in some existing single-ended output CML transmitters, if the bias current of the CML transmitter is IOL, the load current in the output leg may be IOL/2 while the load current in the non-output leg may be IOL. Such a delta current may give rise to supply noise, which may be amplified if there are several single-ended output CML transmitters in close proximity that are simultaneously switching output noise.

According to one or more aspects of the disclosure, the supply noise associated with internal voltage supply VDDIO 128 may be reduced by removing or reducing the delta current relative to an existing single-ended output CML transmitter. For example, the delta current may be shifted to a ground network, and the second load current 132 may be configured to be equal (or at least more equal than in an existing single-ended output CML transmitter) to the first load current 124. In some cases, shifting the delta current to a ground network may reduce supply noise because the ground network is more immune to noise than a supply network (e.g., internal voltage supply VDDIO 128). Thus, according to one or more aspects of the disclosure, a current drawn on the voltage supply VDDIO may be equalized during both polarities using the enhanced CML transmitter.

In some cases, the enhanced CML transmitter 101 may be included in variety of electrical and electronic devices, such as integrated circuits, and memory devices. For example, the enhanced CML transmitter 101 may be utilized by an electrical or electronic device for outputting data serially within the device or external to the device.

Figure 2:
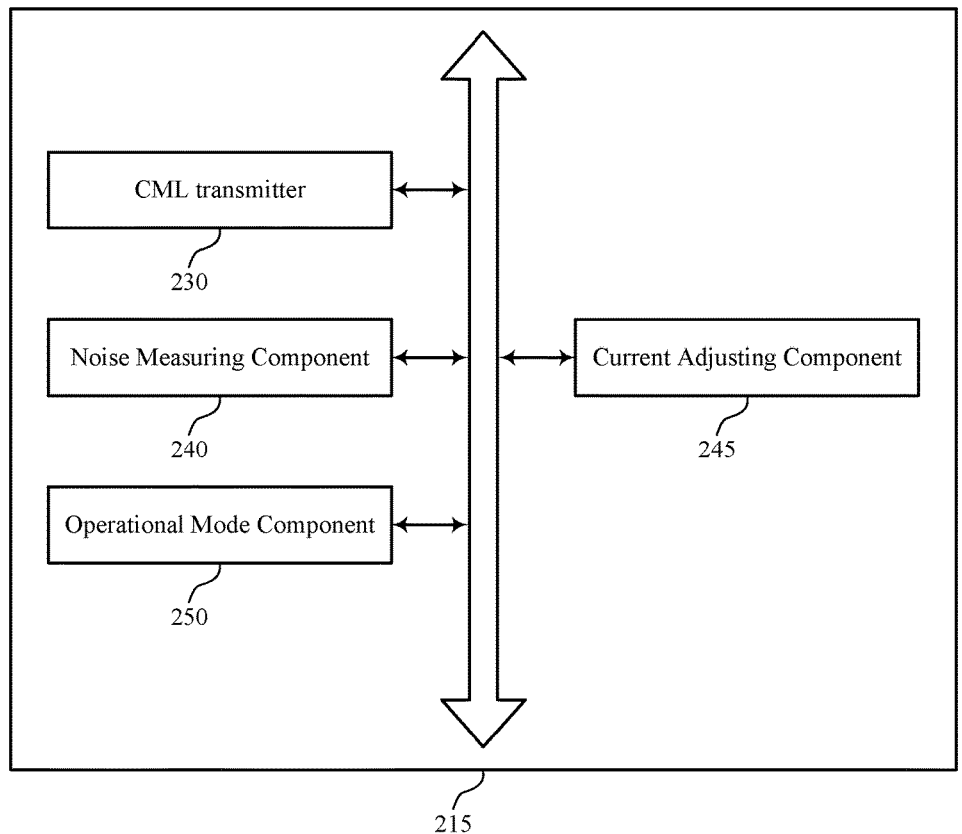
FIG. 2 shows block diagrams of a device that supports method to reduce supply noise in single-ended CML transmitters in accordance with examples of the present disclosure.

FIG. 2 shows a block diagram 200 of a device 215 that supports methods to reduce supply noise in CML transmitters in accordance with examples of the present disclosure. The device 215 may be associated with CML transmitter 230, noise measuring component 240, and current adjusting component 245, and operational mode component 250. In some cases, the device 215 may further include a controller (not shown) controlling the functionalities of the noise measuring component 240, the current adjusting component 245, and the operational mode component 250. In other cases, current adjusting component 245 may comprise a controller. Each of these modules may communicate, directly or indirectly, with one another (e.g., via one or more buses).

CML transmitter 230 may be an enhanced CML transmitter 101 as described in reference to FIG. 1.

Noise measuring component 240 may be configured to determine an amount of supply noise associated with CML transmitter 230 (e.g., noise measurement for a voltage supply of the CML transmitter 230).

Operational mode component 250 may determine an operational mode of the CML transmitter. In some cases, the operational mode includes at least one of a power conservation mode and a performance mode, which may have characteristics as described above.

Current adjusting component 245 may adjust (e.g., increase or decrease, activate or deactivate, or otherwise configure) an offset current in CML transmitter 230 (e.g., a bias current for a second differential transistor pair, such as second bias current 142) based on a noise measurement (e.g., as measured by noise measuring component 240) or on an operational mode (e.g., as determined by operational mode component 250).

Figure 3:
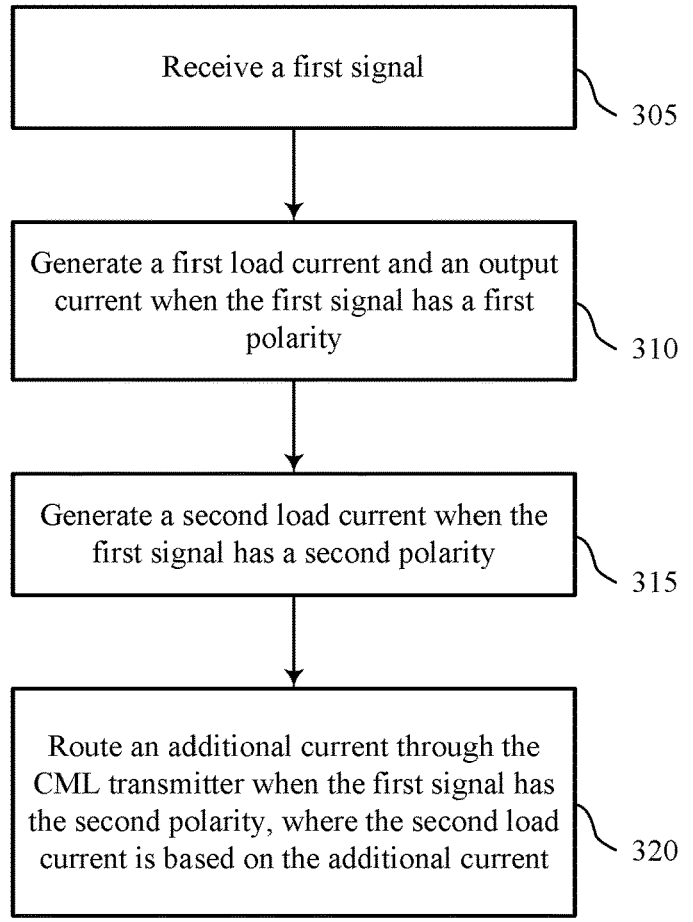
FIGS. 3 through 5 illustrate methods to reduce supply noise in single-ended CML transmitters in accordance with examples of the present disclosure.

FIG. 3 shows a flowchart illustrating a method 300 for method to reduce supply noise in CML transmitters in accordance with examples of the present disclosure. The operations of method 300 may be implemented by a CML transmitter 101 or its components as described herein. For example, the operations of method 300 may be performed by a CML transmitter as described with reference to FIG. 1.

In some cases, the method may include—and an apparatus as described herein may include features, means, or instructions for—receiving a first signal at a CML transmitter, generating, by the CML transmitter, a first load current and an output current when the first signal has a first polarity, generating, by the CML transmitter, a second load current when the first signal has a second polarity, and routing an additional current through the CML transmitter when the first signal has the second polarity, where the second load current is based at least in part on the additional current. The additional current may be, for example, a bias current for a second differential transistor pair, such as second bias current 142. The second load current may be further based on a bias current of the CML transmitter, which may be the bias current of a first differential transistor pair that is included in the CML transmitter.

In some cases, the first signal having the first polarity comprises a signal resulting from a first input line of the CML transmitter having a voltage less than a second input line of the CML transmitter; and the first signal having the second polarity comprises the signal resulting from the first input line of the CML transmitter having a voltage greater than the second input line of the CML transmitter.

In some cases, the method may also include—and an apparatus as described herein may also include features, means, or instructions for—routing the additional current to a ground reference when the first signal has the first polarity. The method may also include—and an apparatus as described herein may also include features, means, or instructions for—generating the additional current based on a bias current associated with the CML transmitter (e.g., a bias current of a first differential transistor pair that is included in the CML transmitter, such as first bias current 140). In some cases, the method may also include—and an apparatus as described herein may also include features, means, or instructions for—generating the additional current based at least in part on the output current, or alternatively or additionally based at least in part on the first load current.

In some cases, the method may also include—and an apparatus as described herein may also include features, means, or instructions for—routing the additional current based at least in part on a second signal, the second signal synchronized with the first signal and configured to have a same polarity as the first signal. The CML transmitter may comprise a first differential transistor pair, and routing the offset current based on the second signal may comprise receiving the second signal at a second differential transistor pair, the second differential transistor pair coupled with the first differential transistor pair. In some cases, the first signal and the second signal are a same signal. In some cases, the additional current has a magnitude of one half a bias current of the CML transmitter (e.g., one half a bias current of the first differential transistor pair). In some cases, when the first signal has the second polarity, the bias current of the CML transmitter may comprise the second load current and the additional current (e.g., the magnitude of the bias current of the CML transmitter may equal the magnitude of the second load current plus the magnitude of the additional current). For example, when the first signal has the second polarity, the second load current and the additional current may combine to form the bias current of the CML transmitter.

In some cases, the method may also include—and an apparatus as described herein may also include features, means, or instructions for—adjusting the offset current based at least in part on a noise measurement for a voltage supply of the CML transmitter. The method may also include—and an apparatus as described herein may also include features, means, or instructions for—determining an operational mode of the CML transmitter. In some cases, the method may also include—and an apparatus as described herein may also include features, means, or instructions for—adjusting the offset current based at least in part on the operational mode. The operational mode may comprise at least one of a first mode that prioritizes power conservation over CML transmitter performance or a second mode that prioritizes CML transmitter performance over power conservation.

In some examples, an apparatus may perform aspects of the functions described below using special-purpose hardware. The apparatus may include first differential transistor pair of a CML transmitter, the first differential transistor pair comprising a first transistor and a second transistor, and a second differential transistor pair comprising a third transistor and a fourth transistor. In some cases, a first branch of the first differential transistor pair is coupled with a first branch of the second differential transistor pair. A second branch of the first differential transistor pair is configured to be coupled with a load external to the CML transmitter.

In some examples, the first transistor and the second transistor are nmos transistors and the third transistor and the fourth transistor are pmos transistors. Alternatively, in some examples, the first transistor and the second transistor are pmos transistors and the third transistor and the fourth transistor are nmos transistors.

In some examples the apparatus may include a current source coupled with the second differential transistor pair. The current source may be configured to generate a bias current for the second differential transistor pair that is proportional to an output current of the CML transmitter. In some examples, the second differential transistor pair is configured to route a bias current for the second differential transistor pair through the first branch of the first differential transistor pair.

In some examples, an apparatus may perform aspects of the functions described below using special-purpose hardware. The apparatus may include a first differential transistor pair of a CML transmitter and a second differential transistor pair coupled with a first branch of the first differential transistor pair. The apparatus may be configured to receive a first signal at the first differential transistor pair. In some cases, the first differential transistor pair is configured to generate a first load current and an output current when the first signal has a first polarity. Further, the first differential transistor pair is configured to generate a second load current when the first signal has a second polarity. The apparatus may be configured to receive a second signal at the second differential transistor pair. In some examples, the second differential transistor pair is configured to route a bias current for the second differential transistor pair through the CML transmitter when the first signal has the second polarity. The second load current, in some cases, is based on the bias current for the second differential transistor pair and a bias current for the first differential pair.

In some examples, the apparatus may be configured to route the bias current for the second differential transistor pair to a ground reference when the first signal has the first polarity. In some examples, the apparatus may be configured to combine the bias current for the second differential transistor pair with the second load current when the first signal has the second polarity. In some cases, the apparatus may be configured to generate the bias current for the second differential transistor pair as equal in magnitude to the output current.

The apparatus may include a controller configured to adjust the bias current for the second differential transistor pair based on a noise measurement for a voltage supply of the CML transmitter. In some cases, the controller may be configured to determine an operational mode of the CML transmitter and adjust the offset current based at least in part on the operational mode.

At 305 the CML transmitter 215 may receive a first signal. The operations of 305 may be performed according to the methods described with reference to FIGS. 1 and 2. In certain examples, aspects of the operations of 305 may be performed by a CML transmitter 101 as described with reference to FIG. 1, including by a first differential transistor pair 102 as described with reference to FIG. 1.

At 310 the CML transmitter 215 may generate a first load current and an output current when the first signal has a first polarity. The operations of 310 may be performed according to the methods described with reference to FIGS. 1 and 2. In certain examples, aspects of the operations of 310 may be performed by a CML transmitter 101 as described with reference to FIG. 1, including by a first differential transistor pair 102 as described with reference to FIG. 1.

At 315 the CML transmitter 215 may generate a second load current when the first signal has a second polarity. The operations of 315 may be performed according to the methods described with reference to FIGS. 1 and 2. In certain examples, aspects of the operations of 315 may be performed by a CML transmitter 101 as described with reference to FIG. 1, including by a first differential transistor pair 102 as described with reference to FIG. 1.

At 320 the CML transmitter 215 may route an additional current through the CML transmitter when the first signal has the second polarity, wherein the second load current is based at least in part on the additional current. The operations of 320 may be performed according to the methods described with reference to FIGS. 1 and 2. In certain examples, aspects of the operations of 320 may be performed by a CML transmitter 101 as described with reference to FIG. 1, including by a second differential transistor pair 104 as described with reference to FIG. 1.

Figure 4:
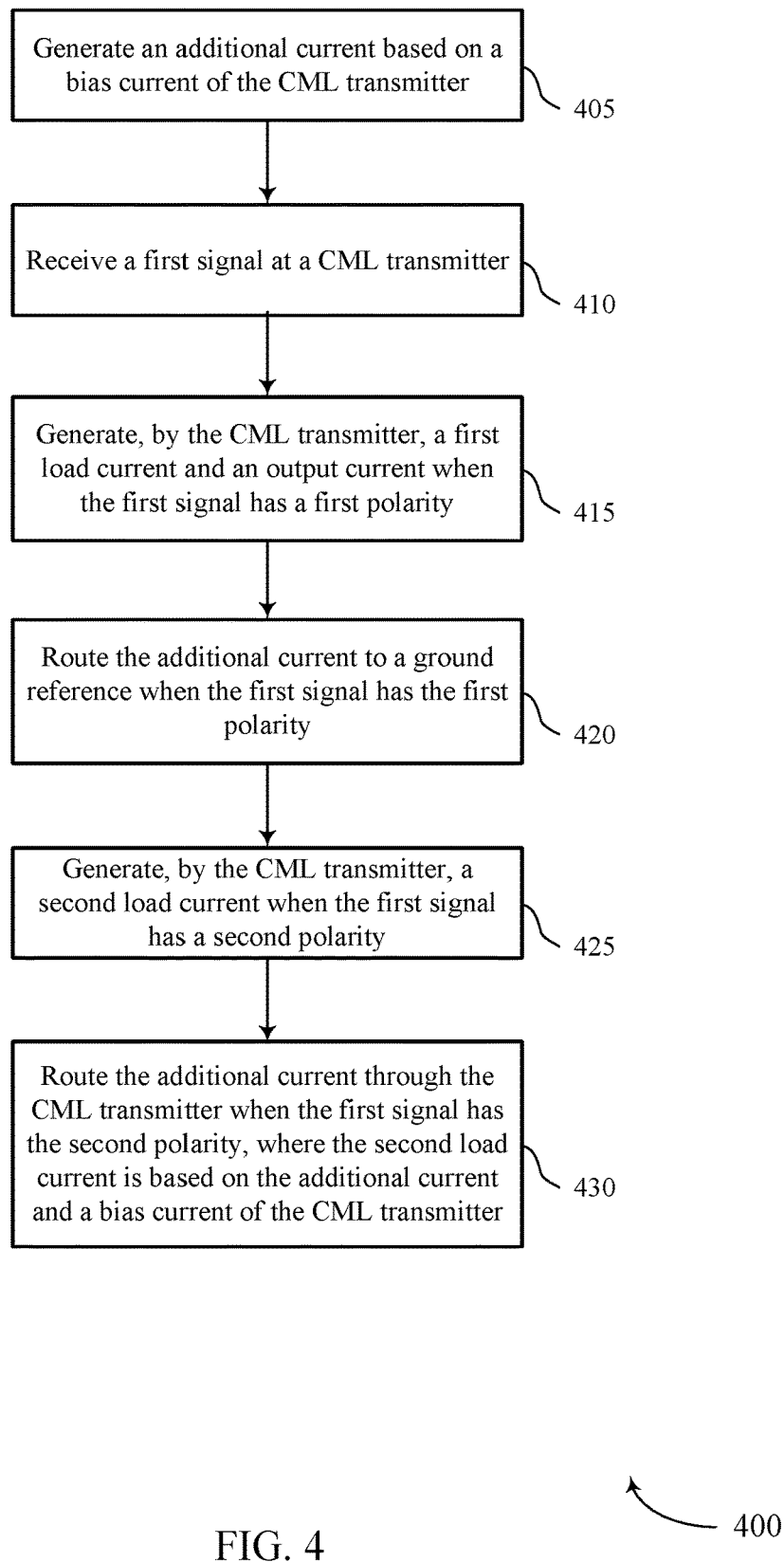

FIG. 4 shows a flowchart illustrating a method 400 for method to reduce supply noise in CML transmitters in accordance with examples of the present disclosure. The operations of method 400 may be implemented by a CML transmitter 101 or its components as described herein. For example, the operations of method 400 may be performed by a CML transmitter as described with reference to FIG. 1.

In some cases, the method may also include—and an apparatus as described herein may also include features, means, or instructions for—receiving a first signal at a CML transmitter. The method may also include generating, by the CML transmitter, a first load current and an output current when the first signal has a first polarity. In some cases, the method may also include routing an additional current to a ground reference when the first signal has the first polarity. The method may also include generating, by the CML transmitter, a second load current when the first signal has a second polarity. In some cases, the method may also include routing the additional current through the CML transmitter when the first signal has the second polarity, wherein the second load current is based at least in part on the additional current and a bias current of the CML transmitter.

At 405, the CML transmitter 101 may generate an additional current. The CML transmitter 101 may generate the additional current based on a bias current of the CML transmitter. The operations of 405 may be performed according to the methods described with reference to FIGS. 1 and 2. In certain examples, aspects of the operations of 405 may be performed by a CML transmitter 101 as described with reference to FIG. 1, including by a current source 114 as described with reference to FIG. 1.

At 410 the CML transmitter 101 may receive a first signal. The operations of 410 may be performed according to the methods described with reference to FIGS. 1 and 2. In certain examples, aspects of the operations of 410 may be performed by a CML transmitter 101 as described with reference to FIG. 1, including by a first differential transistor pair 102 as described with reference to FIG. 1.

At 415 the CML transmitter 101 may generate a first load current and an output current when the first signal has a first polarity. The operations of 415 may be performed according to the methods described with reference to FIGS. 1 and 2. In certain examples, aspects of the operations of 415 may be performed by a CML transmitter 101 as described with reference to FIG. 1, including by a first differential transistor pair 102 as described with reference to FIG. 1.

At 420 the CML transmitter 101 may route the additional current to a ground reference when the first signal has the first polarity. The operations of 420 may be performed according to the methods described with reference to FIGS. 1 and 2. In certain examples, aspects of the operations of 420 may be performed by a CML transmitter 101 as described with reference to FIG. 1, including by a second differential transistor pair 104 as described with reference to FIG. 1.

At 425 the CML transmitter 101 may generate a second load current when the first signal has a second polarity. The operations of 425 may be performed according to the methods described with reference to FIGS. 1 and 2. In certain examples, aspects of the operations of 425 may be performed by a CML transmitter 101 as described with reference to FIG. 1, including by a first differential transistor pair 102 as described with reference to FIG. 1.

At 430 the CML transmitter 215 may route the additional current through the CML transmitter 215 when the first signal has the second polarity. In some cases, the second load current is based on the offset current. In some cases, the second load current is also based on the bias current of the CML transmitter. The operations of 430 may be performed according to the methods described with reference to FIGS. 1 and 2. In certain examples, aspects of the operations of 430 may be performed by a CML transmitter 101 as described with reference to FIG. 1, including by a second differential transistor pair 104 as described with reference to FIG. 1.

Figure 5:
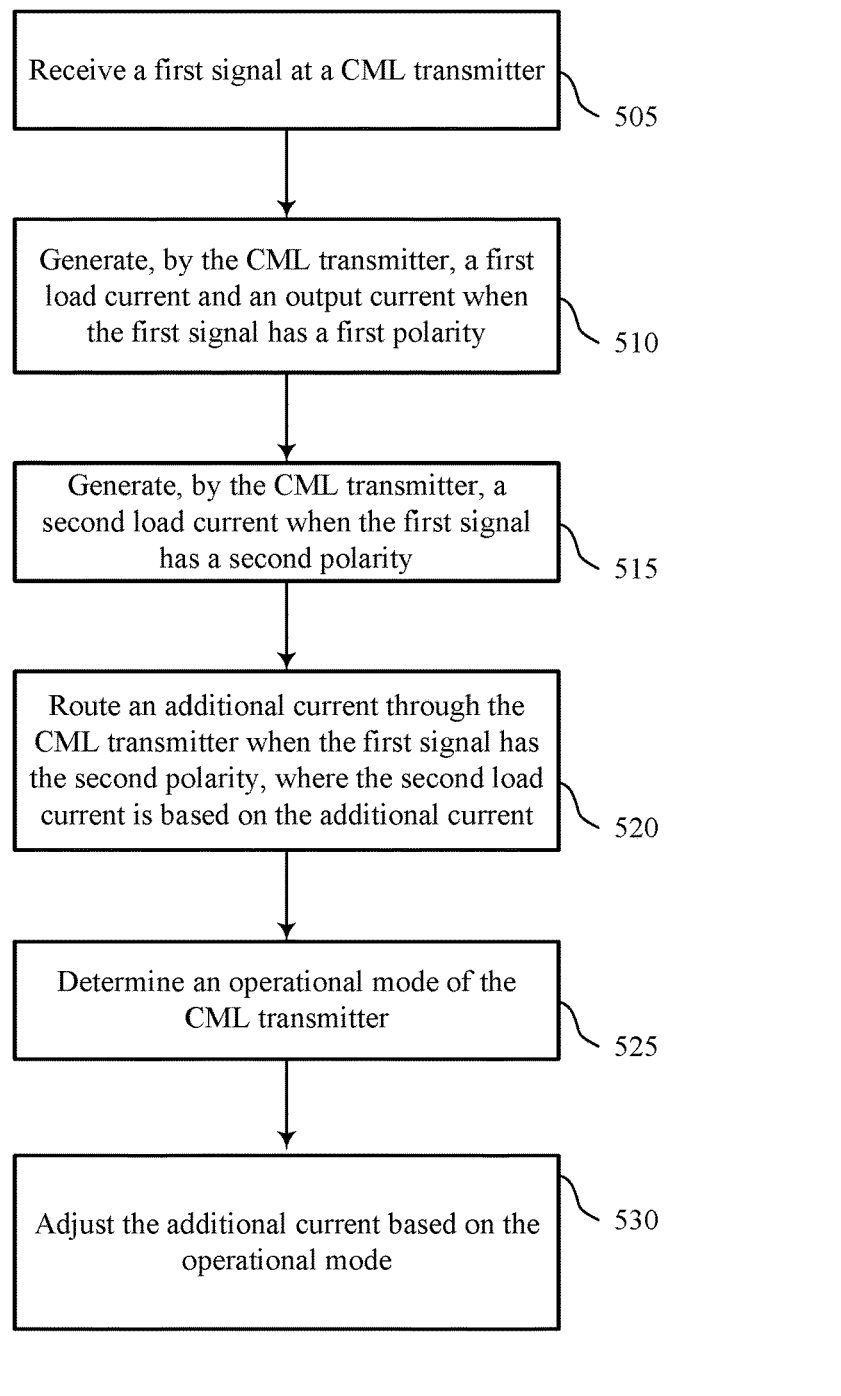

FIG. 5 shows a flowchart illustrating a method 500 for method to reduce supply noise in CML transmitters in accordance with examples of the present disclosure. The operations of method 500 may be implemented by a CML transmitter 101 or its components as described herein. For example, the operations of method 500 may be performed by a CML transmitter as described with reference to FIG. 1 or a device 215 as described with reference to FIG. 2.

In some cases, the method may include—and an apparatus as described herein may also include features, means, or instructions for—receiving a first signal at a CML transmitter. The method may also include generating, by the CML transmitter, a first load current and an output current when the first signal has a first polarity. In some cases, the method may also include generating, by the CML transmitter, a second load current when the first signal has a second polarity. The method may also include routing an additional current through the CML transmitter when the first signal has the second polarity, wherein the second load current is based at least in part on the additional current. The method may also include determining an operational mode of the CML transmitter. In some cases, the method may also include adjusting the additional current based at least in part on the operational mode.

At 505 the CML transmitter 101 may receive a first signal at a CML transmitter. The operations of 505 may be performed according to the methods described with reference to FIGS. 1 and 2. In certain examples, aspects of the operations of 505 may be performed by a CML transmitter 101 as described with reference to FIG. 1, including by a first differential transistor pair 102 as described with reference to FIG. 1.

At 510 the CML transmitter 101 may generate, by the CML transmitter, a first load current and an output current when the first signal has a first polarity. The operations of 510 may be performed according to the methods described with reference to FIGS. 1 and 2. In certain examples, aspects of the operations of 510 may be performed by a CML transmitter 101 as described with reference to FIG. 1, including by a first differential transistor pair 102 as described with reference to FIG. 1.

At 515 the CML transmitter 101 may generate, by the CML transmitter, a second load current when the first signal has a second polarity. The operations of 515 may be performed according to the methods described with reference to FIGS. 1 and 2. In certain examples, aspects of the operations of 515 may be performed by a CML transmitter 101 as described with reference to FIG. 1, including by a first differential transistor pair 102 as described with reference to FIG. 1.

At 520 the CML transmitter 101 may route an additional current through the CML transmitter when the first signal has the second polarity, where the second load current is based at least in part on the additional current. The operations of 520 may be performed according to the methods described with reference to FIGS. 1 and 2. In certain examples, aspects of the operations of 520 may be performed by a CML transmitter 101 as described with reference to FIG. 1, including by a second differential transistor pair 102 as described with reference to FIG. 1.

At 525 the CML transmitter 215 may determine an operational mode of the CML transmitter. The operations of 525 may be performed according to the methods described with reference to FIGS. 1 and 2. In certain examples, aspects of the operations of 525 may be performed by a CML transmitter 101 as described with reference to FIG. 1 or a device 215 as described with reference to FIG. 2, including by an operational mode component 250 as described with reference to FIG. 2.

At 530 the CML transmitter 215 may adjust the additional current based on the operational mode. The operations of 530 may be performed according to the methods described with reference to FIGS. 1 and 2. In certain examples, aspects of the operations of 530 may be performed by a CML transmitter 101 as described with reference to FIG. 1 or a device 215 as described with reference to FIG. 2, including by a current adjusting component 245 as described with reference to FIG. 2.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" (e.g. communicatively coupled) refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a current mode logic (CML) transmitter; and
a controller coupled with the CIVIL transmitter, the controller operable to cause the apparatus to:
receive a first signal at the CML transmitter;
generate, by the CML transmitter, a first load current and an output current when the first signal has a first polarity;
route an additional current to a ground reference when the first signal has the first polarity;
generate, by the CIVIL transmitter, a second load current when the first signal has a second polarity; and route the additional current through the CML transmitter when the first signal has the second polarity, wherein the second load current is based at least in part on the additional current and a bias current of the CIVIL transmitter.

2. The apparatus of claim 1, wherein the controller is further operable to cause the apparatus to:
generate the additional current based at least in part on the output current; and
route the additional current based at least in part on a second signal, the second signal synchronized with the first signal and configured to have a same polarity as the first signal.

3. The apparatus of claim 2, wherein the CIVIL transmitter comprises a first differential transistor pair, and the controller is further operable to cause the apparatus to:
route the additional current based at least in part on the second signal comprises receiving the second signal at a second differential transistor pair, the second differential transistor pair coupled with the first differential transistor pair.

4. The apparatus of claim 2, wherein the controller is further operable to cause the apparatus to:
generate the additional current based at least in part on the bias current of the CML transmitter.

5. The apparatus of claim 4, wherein the additional current has a magnitude of one half the bias current of the CIVIL transmitter.

6. The apparatus of claim 2, wherein the first signal and the second signal are a same signal.

7. The apparatus of claim 1, wherein, when the first signal has the second polarity, the bias current of the CIVIL transmitter comprises the second load current and the additional current.

8. The apparatus of claim 1, wherein the controller is further operable to cause the apparatus to:
adjust the additional current based at least in part on a noise measurement for a voltage supply of the CIVIL transmitter.

9. The apparatus of claim 1, wherein the controller is further operable to cause the apparatus to:
determine an operational mode of the CML transmitter; and
adjust the additional current based at least in part on the operational mode.

10. The apparatus of claim 9, wherein the operational mode comprises one or both of a first mode that prioritizes power conservation over CML transmitter performance or a second mode that prioritizes CML transmitter performance over power conservation.

11. The apparatus of claim 1, wherein:
the first signal having the first polarity comprises a signal resulting from a first input line of the CML transmitter having a voltage less than a second input line of the CML transmitter; and
the first signal having the second polarity comprises the signal resulting from the first input line of the CIVIL transmitter having a voltage greater than the second input line of the CML transmitter.

12. An apparatus, comprising:
means for receiving a first signal at a current mode logic (CML) transmitter;
means for generating, by the CML transmitter, a first load current and an output current when the first signal has a first polarity;

means for routing an additional current to a ground reference when the first signal has the first polarity;
means for generating, by the CIVIL transmitter, a second load current when the first signal has a second polarity; and
means for routing the additional current through the CML transmitter when the first signal has the second polarity, wherein the second load current is based at least in part on the additional current and a bias current of the CIVIL transmitter.

13. The apparatus of claim 12, further comprising:
means for generating the additional current based at least in part on the output current; and
means for routing the additional current based at least in part on a second signal, the second signal synchronized with the first signal and configured to have a same polarity as the first signal.

14. The apparatus of claim 13, wherein:
the CML transmitter comprises a first differential transistor pair; and
the means for routing the additional current based at least in part on the second signal comprise means for receiving the second signal at a second differential transistor pair, the second differential transistor pair coupled with the first differential transistor pair.

15. The apparatus of claim 13, further comprising:
means for generating the additional current based at least in part on the bias current of the CML transmitter.

16. The apparatus of claim 15, wherein the additional current has a magnitude of one half the bias current of the CIVIL transmitter.

17. The apparatus of claim 13, wherein the first signal and the second signal are a same signal.

18. The apparatus of claim 12, wherein, when the first signal has the second polarity, the bias current of the CML transmitter comprises the second load current and the additional current.

19. The apparatus of claim 12, further comprising:
means for adjusting the additional current based at least in part on a noise measurement for a voltage supply of the CIVIL transmitter.

20. An apparatus, comprising:
a first differential transistor pair of a current mode logic (CIVIL) transmitter;
a second differential transistor pair; and
a controller coupled with the first differential transistor pair and the second differential transistor pair, the controller operable to cause the apparatus to:
receive a first signal at the first differential transistor pair, the first differential transistor pair configured to generate a first load current and an output current when the first signal has a first polarity and to generate a second load current when the first signal has a second polarity; and
receive a second signal at the second differential transistor pair, the second differential transistor pair configured to route a bias current for the second differential transistor pair to a ground reference when the first signal has the first polarity and to route the bias current for the second differential transistor pair through the first differential transistor pair when the first signal has the second polarity, the second load current based at least in part on the bias current for the second differential transistor pair and a bias current for the first differential transistor pair.

* * * * *

UNITED STATES PATENT AND TRADEMARK OFFICE
CERTIFICATE OF CORRECTION

PATENT NO. : 10,277,426 B1
APPLICATION NO. : 16/113538
DATED : April 30, 2019
INVENTOR(S) : Kuehlwein et al.

It is certified that error appears in the above-identified patent and that said Letters Patent is hereby corrected as shown below:

In the Claims

In Claim 1, Column 16, Line 58, delete "CIVIL", and insert --CML--;

In Claim 1, Column 16, Line 66, delete "CIVIL", and insert --CML--;

In Claim 1, Column 17, Line 4, delete "CIVIL", and insert --CML--;

In Claim 3, Column 17, Line 14, delete "CIVIL", and insert --CML--;

In Claim 5, Column 17, Line 28, delete "CIVIL", and insert --CML--;

In Claim 7, Column 17, Line 33, delete "CIVIL", and insert --CML--;

In Claim 8, Column 17, Line 39, delete "CIVIL", and insert --CML--;

In Claim 11, Column 17, Line 58, delete "CIVIL", and insert --CML--;

In Claim 12, Column 18, Line 3, delete "CIVIL", and insert --CML--;

In Claim 12, Column 18, Line 10, delete "CIVIL", and insert --CML--;

In Claim 16, Column 18, Line 30, delete "CIVIL", and insert --CML--;

In Claim 19, Column 18, Line 40, delete "CIVIL", and insert --CML--;

In Claim 20, Column 18, Line 43, delete "CIVIL", and insert --CML--.

Signed and Sealed this
Fifth Day of May, 2020

Andrei Iancu
*Director of the United States Patent and Trademark Office*